United States Patent [19]

Toyoda

[11] Patent Number: 4,865,153

[45] Date of Patent: Sep. 12, 1989

[54] SPEAKER SYSTEM

[75] Inventor: Hirokazu Toyoda, Chiba, Japan

[73] Assignee: Sasaki Glass Co., Ltd., Tokyo, Japan

[21] Appl. No.: 57,361

[22] Filed: May 29, 1987

[30] Foreign Application Priority Data

Jun. 23, 1986 [JP] Japan .............................. 61-95480[U]
Jun. 27, 1986 [JP] Japan .............................. 61-98697[U]
Jul. 9, 1986 [JP] Japan .............................. 61-105467[U]

[51] Int. Cl.$^4$ .............................................. H05K 5/00

[52] U.S. Cl. .................................... 181/153; 181/148; 181/199; 248/632; 381/90; 381/205

[58] Field of Search ......... 181/148, 153, 199, DIG. 1; 381/187, 188, 205, 90; 248/615, 621, 622, 632, 633

[56] References Cited

U.S. PATENT DOCUMENTS

| | | | |
|---|---|---|---|
| 2,881,850 | 4/1959 | Bonn | 181/153 |
| 2,935,279 | 5/1960 | La Porte et al. | 248/632 |
| 3,104,730 | 9/1963 | Brown | 181/199 |
| 3,170,538 | 2/1965 | Detrick | 181/148 X |
| 3,747,880 | 7/1973 | Bock | 181/148 X |
| 3,976,838 | 8/1976 | Stallings, Jr. | 181/153 X |
| 4,190,738 | 2/1980 | Samuels | 381/188 X |
| 4,369,949 | 1/1983 | Zopf | 248/632 |
| 4,574,906 | 3/1986 | White et al. | 181/153 X |

*Primary Examiner*—B. R. Fuller
*Attorney, Agent, or Firm*—Toren, McGeady & Associates

[57] ABSTRACT

A speaker system provided with a globular glass enclosure to which a speaker unit is attached, wherein the enclosure is mounted elastically on a support member which consists of an elastic material and has an opening to accommodate a bottom part of the enclosure therein. The direction of the speaker unit can be freely changed under a stable posture and the occurrence of box noise due to the insufficient contact between the enclosure and the support member is prevented. In the speaker system, the enclosure may be fixed firmly at the position of its notch opening to a baffle board made of a highly rigid and/or highly oscillation-damping material for fixing the speaker unit to the baffle board, and thus the occurrence of box noise coming from the transmission of the vibration of the speaker unit to the enclosure and also coming from the deformation of the opening of the enclosure to receive the speaker unit can be prevented. By providing a light source outside of the enclosure to radiate ultraviolet rays toward the direction of the enclosure, the decorative effect of the speaker system can skillfully be enhanced due to the luminescence of the enclosure.

5 Claims, 8 Drawing Sheets

SPEAKER SYSTEM

BACKGROUND OF THE INVENTION

1. Field of the Invention:

The present invention relates to a loudspeaker system or, to say more in detail, a speaker system provided with a sealed type globular enclosure made of glass, which enclosure serves to attach a speaker unit thereto and is placed elastically on a support member.

2. Description of the Related Art:

Recently a speaker system has been proposed in which a speaker unit is attached to a globular enclosure made of glass. As shown in FIG. 1, a speaker unit 3 is attached to the opening 2 of a globular enclosure made of glass 1. From the physical characteristic of glass and from the reason that the enclosure is globular, such a loudspeaker system is excellent in hi-fi reproduction, and a radiation pattern, which expresses the characteristics of a speaker unit most naturally, is possible. Indeed, by making the shape of an enclosure globular, the high frequency wave characteristic of a speaker system becomes flat in wider directions in a room, and further, with the use of glass, not only the production of a globular enclosure is easy but also a heavy, hard and thick enclosure, which are the basic requisites to repress the vibration of the enclosure itself, can easily be produced, thus increasing the oscillation-damping characteristic of a speaker system remarkably.

However, in such a speaker system, from the reason that the enclosure 1 is globular and the speaker unit 3 is attached part from the center of the enclosure 1, there is a drawback that the enclosure rolls on the floor, and thus it is impossible to maintain the speaker unit to a definite direction correctly. Thus, it is necessary to put the speaker system on a support member prepared particularly.

In FIG. 1, 4 is an example of the conventional support member for this use. The support member 4 is of a box type having its opening at the upper side, and a felt sheet 5 is attached to the edge part of the opening for preventing that the enclosure receives a shock in mounting the speaker system thereon and that the outer face of the enclosure 1 is damaged.

In such a type of support member, however, while it is possible to change the direction of the speaker unit 3 freely, the friction coefficient is as small as 0.36 between the surface of the enclosure 1 and the felt sheet 5 which is attached to the edge part of the opening of the support member 4 on which the enclosure 1 is to be mounted, and accordingly, in the case, for instance, when vibration is given to the support member 4 from outside, the enclosure 1 may rotate due to the moment caused to occur owing to the weight of the speaker unit 3 of it own, changing frequently the direction of the speaker unit 3.

Further, in a speaker system with the use of a globular enclosure made of glass, while the occurrence of so-called box noise, which is caused to occur due to the vibration of the enclosure, which is accompanied by the action of the speaker unit owing to the sound signal, can tolerably be prevented, the prevention is not perfect. The occurrence of box noise is due to the reason that the enclosure itself is resonated with the sound of the speaker unit to form a noise so-called body noise, and the resonance frequency is determined from such factors as the composition (density) and thickness of the glass as well as the enclosure shape and size. Therefore, to repress box noise, it is necessary to make the body noise as small as possible and to damp this noise in a short time.

It is said that there are two causes for the box noise of a speaker system. The one is the compression and expansion of air in the enclosure due to the movement of the cone paper of the speaker unit, and the other is the vibration of the enclosure itself due to the speaker unit's oscillation, which is transmitted through the frame of the speaker unit. The former gives chiefly low sounds, and the latter chiefly medium-high sounds to the enclosure. In a speaker system comprising a globular glass enclosure, the difficulty due to the former reason has almost been dissolved by making the enclosure heavy and rigid and by the proper disposition of a sound absorption material.

However, there is a danger that the support member 4 acts as a resonance box. For preventing the support member from serving as a resonance box and thus to prevent the occurrence of box- or body noise from this reason, while it is desirable to fill up the interior of the support member 4 with a solid matter, it is impossible to produce a perfectly globular enclosure made of glass with a constant outer diameter, forming fluctuation to some extent, from the difficulty in the manufacturing process of globular glass, and therefore, it is difficult to contact the convex-type outer circumference of the enclosure 1 totally with the concave-type inner circumference of the support member 4.

Moreover, in fixing a speaker unit directly to a glass enclosure by using a screw, stress is accumulated at the edge part of the enclosure opening, and there is a danger that said edge part is broken. Therefore, it has been proposed to fix an annular flat plate to serve as a baffle board to the opening of the enclosure with the use of an adhesive, and then to fasten a speaker unit to said baffle board with the use of a screw. In this instance, however, attention has been paid only on the use of an annular flat plate for attaching the speaker unit easily to the enclosure, and accordingly a cheap and easily obtainable material such as aluminium, wood or acrylic resin has been used therefor. Therefore, because of the fact that these materials are inferior in rigidity and oscillation-damping property, they are not sufficient to prevent the occurrence of box noise due to the latter reason, and further, the occurrence of body noise due to the deformation of the enclosure opening can not sufficiently be prevented.

Separately, for the purpose of enhancing the decorative effect of a speaker system with the use of a glass enclosure, a speaker system has been proposed in which a light source is provided in the interior of an enclosure on one hand and, on the other hand, an amplifying circuit is provided from the outside of the enclosure for changing the brightness of the light source in accordance with the change of the quality and tone of the sound. However, in putting a light source in the interior of an enclosure, not only the capacity of the enclosure is diminished, but also the sound quality is deteriorated due to such factors as the heating of the enclosure and the interference to the sound signal caused to occur due to the light source. Further, it is necessary thereby to make a hole in the enclosure for the wiring to the light source. There is also a trouble to remove the speaker unit from the enclosure at the time when the light source must be exchanged due to its life.

SUMMARY OF THE INVENTION

Under such circumstances, the present invention is to solve the above mentioned difficulties in a speaker system provided with a sealed type enclosure made of glass to which a speaker unit is attached. The main object of the invention is to offer a speaker system in which the direction of the speaker unit can freely be changed under a stable posture and simultaneously the occurrence of box noise due to the contact between the enclosure and the support member can be prevented. Another object of the invention is to offer, in the speaker system, a mechanism for preventing the occurrence of box noise and/or body noise coming from the transmission of the vibration of speaker unit to the enclosure and also coming from the deformation of the opening of the enclosure to accommodate the speaker unit thereto. Finally, a third object is to provide an improved speaker system with enhanced decorative effect by illuminating the glass enclosure itself.

The main object of the invention can be attained by providing a support member made of an elastic material for mounting the enclosure thereon, said support member having a large friction coefficient in contact with the enclosure and having an opening to accommodate the bottom part of the enclosure therein.

In the second place, in thus improved speaker system, said enclosure is fixed at the position of its opening to a baffle board made of a highly rigid and/or highly oscillation-damping material, whose slip-elasticity being not lower than 2.3 Pa and whose damping coefficient being not lower than 2%, and the speaker unit is fixed to said baffle board.

To provide a speaker system with improved decorative effect, the glass constituting the enclosure is made into transparent and let to contain elements to generate fluorescent light when it receives ultraviolet light radiation, and a light source is provided outside of the enclosure for radiating light chiefly in ultraviolet region toward the direction of the enclosure.

BRIEF EXPLANATION OF THE DRAWINGS

FIG. 2(*a*) is a plane view, FIG. 2(*b*) is a sectional view and FIG. 2(*c*) is an oblique view showing the example of the support member.

DETAILED DESCRIPTION OF THE PREFERRED EMBODIMENTS

The embodiments of the present invention will be described in detail in the following with reference to the examples of the inventive apparatus.

EXAMPLE 1

Figure 1:
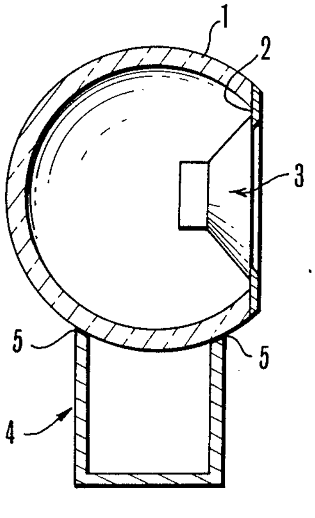
FIG. 1 is a sectional view of a conventional speaker system provided with a globular glass enclosure.
Figure 2A:
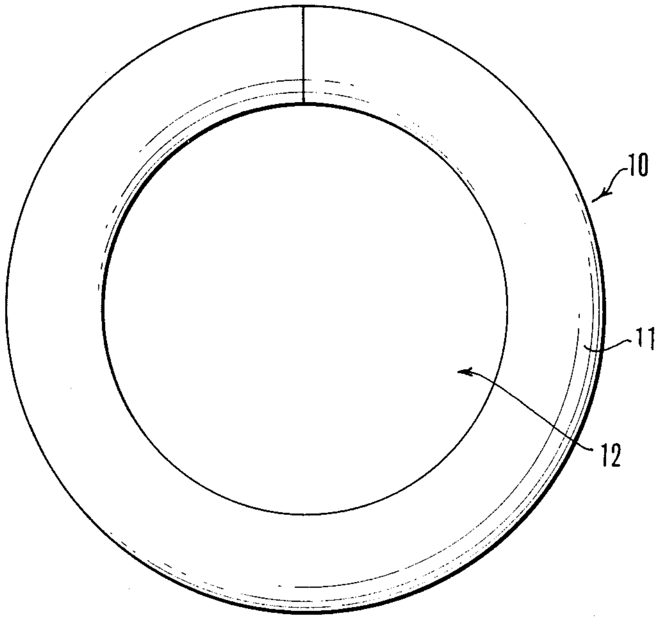
FIGS. 2(*a*), 2(*b*) and 2(*c*) show, respectively, an example of the support member of the present inventive speaker system.
Figure 2B:
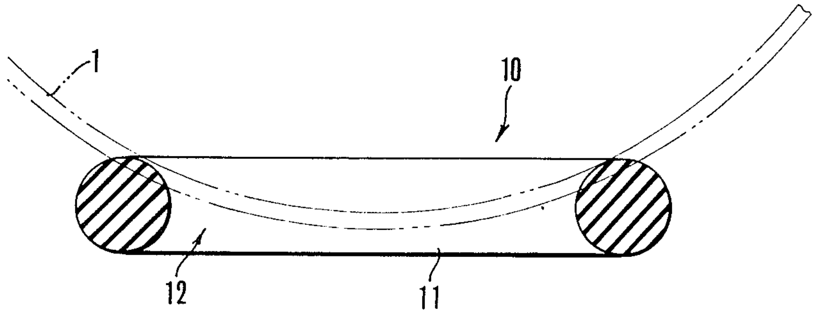
Figure 2C:
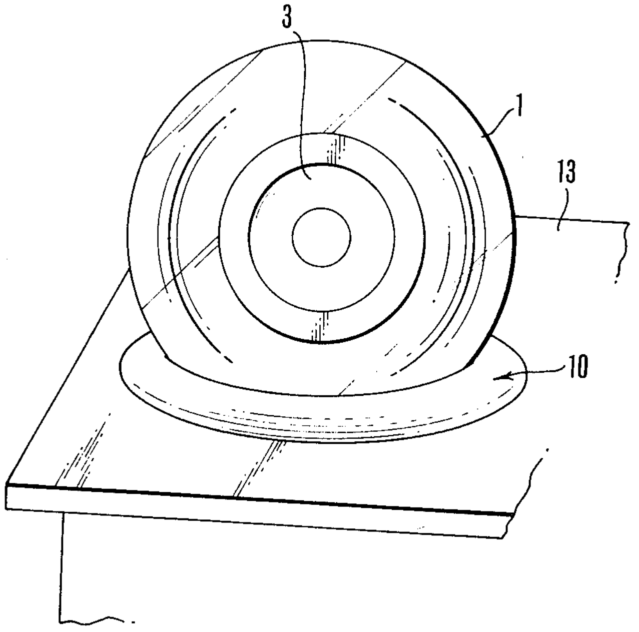

In this example, a globular glass enclosure provided with a speaker unit, for instance, as shown in FIG. 1 is mounted on a support member as shown in FIGS. 2(*a*), 2(*b*) and 2(*c*). The support member 10 in this figure comprises a circular ring obtained by joining both end faces of a cylindrical rod 11 for forming a circular hole 12 in which a globular glass enclosure 1 is to be accommodated (cf. FIGS. 2(*a*) and 2(*b*)). The support member 10 is placed, for instance, on a stand or table 13 as shown in FIG. 2(*c*). In order to prevent the bottom of the enclosure 1 from contacting with the surface of the stand 13, the inner diameter of the circular hole 12 of the support member 10 and the diameter of the cylindrical rod 11 for forming a support member 10 are controlled in accordance with the diameter of the enclosure 1 (cf. FIG. 2(*b*)). For example, the support member 10 is made of a cylindrical rod 11 with a diameter of 30 mm and has a circular hole 12 with a diameter of 240 mm for supporting an enclosure 1 with a diameter of 500 mm.

It is desirable that the materials for a support member 10 have following characteristics:

(a) The friction coefficient in contact with the glass of the enclosure 1 is large, and the friction coefficient changes only a little in the course of aging.

(b) It is possible that the elastic deformation takes place due to the weight of the enclosure itself.

(c) The oscillation absorbing power is sufficient so that the box noise of the enclosure is prevented and the vibration thereof from outside can effectively be absorbed.

As the materials for the support member 10 satisfying these requisites, there are following substances:

(a) chlorinated polyethylene (friction coefficient: 0.4, hardness: 50–85 degrees), (b) silicone rubber (hardness: 30–90 degrees), and (c) neoprene rubber (friction coefficient: 0.57, hardness: 60 degrees).

Namely, by using a support member 10 comprising a material with a large friction coefficient in contact with the glass constituting the enclosure 1, and by making the contact area between the outer circumference of the enclosure 1 and the support member 10 sufficiently large for enabling the elastic deformation under the state that the speaker system is supported by the support member 10, it is possible to obtain a friction force sufficiently larger than the rotation force applied to the enclosure 1 due to the effect of the weight of the speaker unit 3, and, accordingly, it is possible to support the speaker system stably in all the directions as desired. As the friction coefficient changes only a little due to aging, it is possible to support the speaker system with a sufficient friction force for a long while even when the direction of the speaker unit 3 is changed frequently in use.

Moreover, since the support member 10 is deformed elastically due to the weight of the speaker system, even when there is a deviation to some extent in the size and shape of the enclosure 1 manufactured, the support member 10 and the enclosure 1 contact with each other closely all over the contact region on them, and therefore, the occurrence of resonance due to insufficient contact between the enclosure 1 and the support member 10 can perfectly be prevented.

Figure 3:
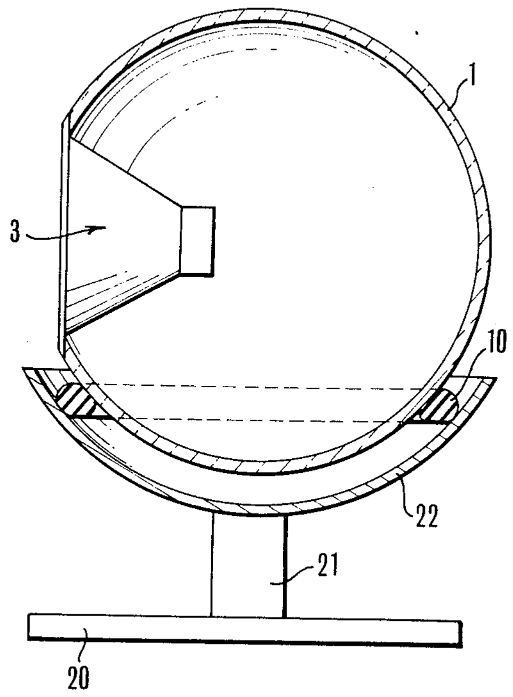
FIG. 3 is a sectional view showing another example of the support member provided with an enclosure in FIG. 2.

FIG. 3 shows a modification of the speaker system in FIG. 2, in which the stand 13 is substituted with a stand comprising the base part 20, the leg part 21 and the bowl part 22 as shown in the figure. The speaker system is placed in such a way that its support member 10 is in contact with the inner periphery of the bowl part 22 of this stand. In this instance, the lower part of the enclosure 1 may be situated below the lower face of the circular hole 12 of the support member 10. The speaker system of this type is very convenient in certain cases.

Figure 4A:
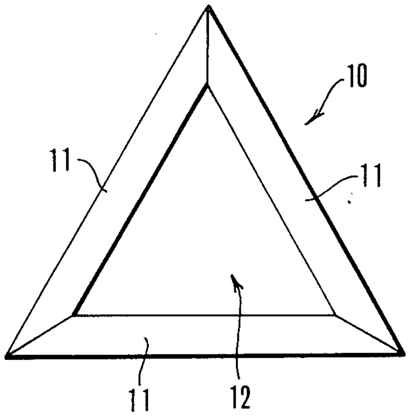
FIGS. 4(*a*) and 4(*b*) are plane views showing, respectively, a modification of the support member.
Figure 4B:
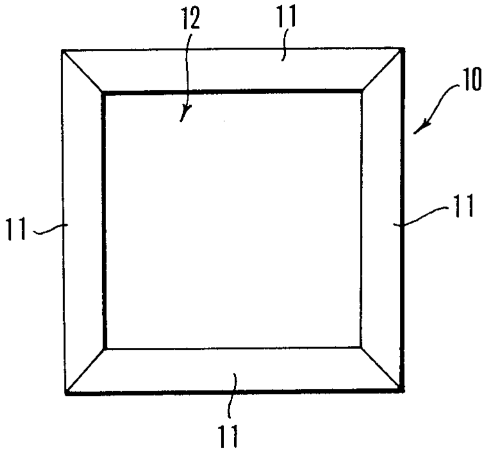

FIGS. 4(*a*) and 4(*b*) show further modifications of the support member in FIG. 2. While the support member 10 shown in FIG. 2 has a circular hole 12 prepared by joining both end faces of a cylindrical rod 11, the support member 10 in the modification shown in FIG. 4(*a*) comprises a body of regular triangle prepared by joining three pieces of a rod, and the support member 10 in the modification shown in FIG. 4(*b*) comprises similarly a body of regular quadrangle. In these instances, the shape of the rod 11 is not limited to a circular, and such shapes as rectangular and trapezoidal may be used.

Figure 5:
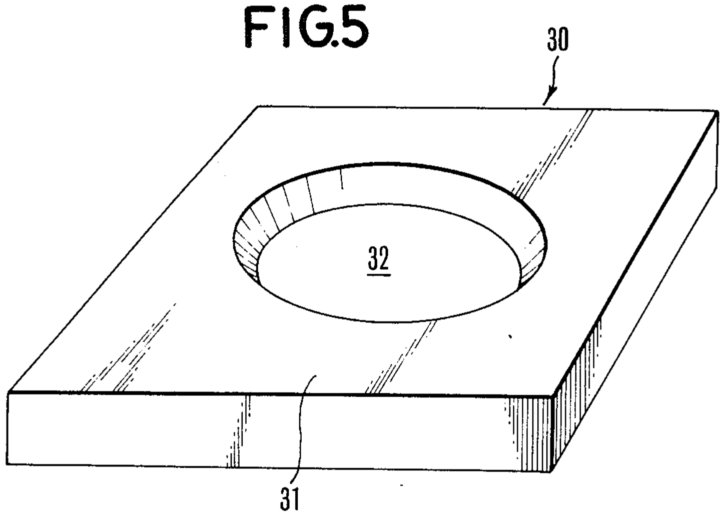
FIG. 5 is an oblique view showing a further modification of the support member.

In a still further modification of the support member as shown in FIG. 5, the support member 30 comprises a thick plate 31 with the same quality as the cylindrical rod 11 used as a support member 10 in FIG. 2, in which a circular hole 32 is provided so as to accommodate the lower part of the enclosure 1 therein. It is desirable to control the size of the plate 31 so that the outer circumference of the enclosure 1 mounted thereon does not get out of the side of said plate. A speaker system of this type is suitable for placing it at the corner of a room or at the side of a wall for preventing the danger that the enclosure is injured in such a case as the enclosure contacts with the wall.

As above described, the speaker system in this example has such merits that the speaker system comprising a globular glass enclosure can be supported stably in all directions freely and further that the speaker system can be isolated from the vibration from outside and of its own.

EXAMPLE 2

Figure 6:
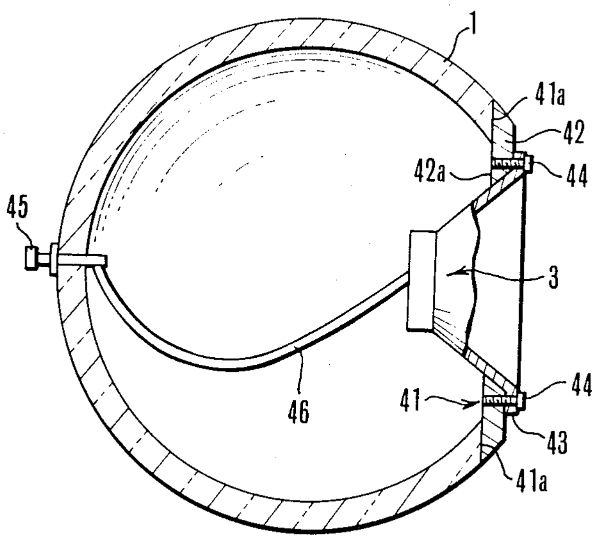
FIG. 6 is a sectional view of the speaker system of the present invention.

In this example, the attachment of the speaker unit 3 to the globular glass enclosure 1 is improved as shown in FIG. 6. In the figure, 1 is a globular glass enclosure similarly as in Example 1, in which an opening 41 is provided for fixing a speaker unit 3 thereto. It is desirable that the enclosure is made of a colorless and transparent glass. To the opening end 41a of said opening 41, a flat baffle board made into circular ring 42 and having a hole part 42a is fixed firmly by using an adhesive. To seal the enclosure 1 tightly, the speaker unit 3 is inserted into the hole part 42a of the baffle board 42 by putting a sealing material 43 made of a material such as rubber therebetween, and the speaker unit 3 is fixed firmly to the baffle board 42 by means of screws 44. 45 is an input terminal of electric current, and 46 is a lead wire provided inside of the enclosure 1 for communicating said terminal 45 to the speaker unit 3.

Figure 7:
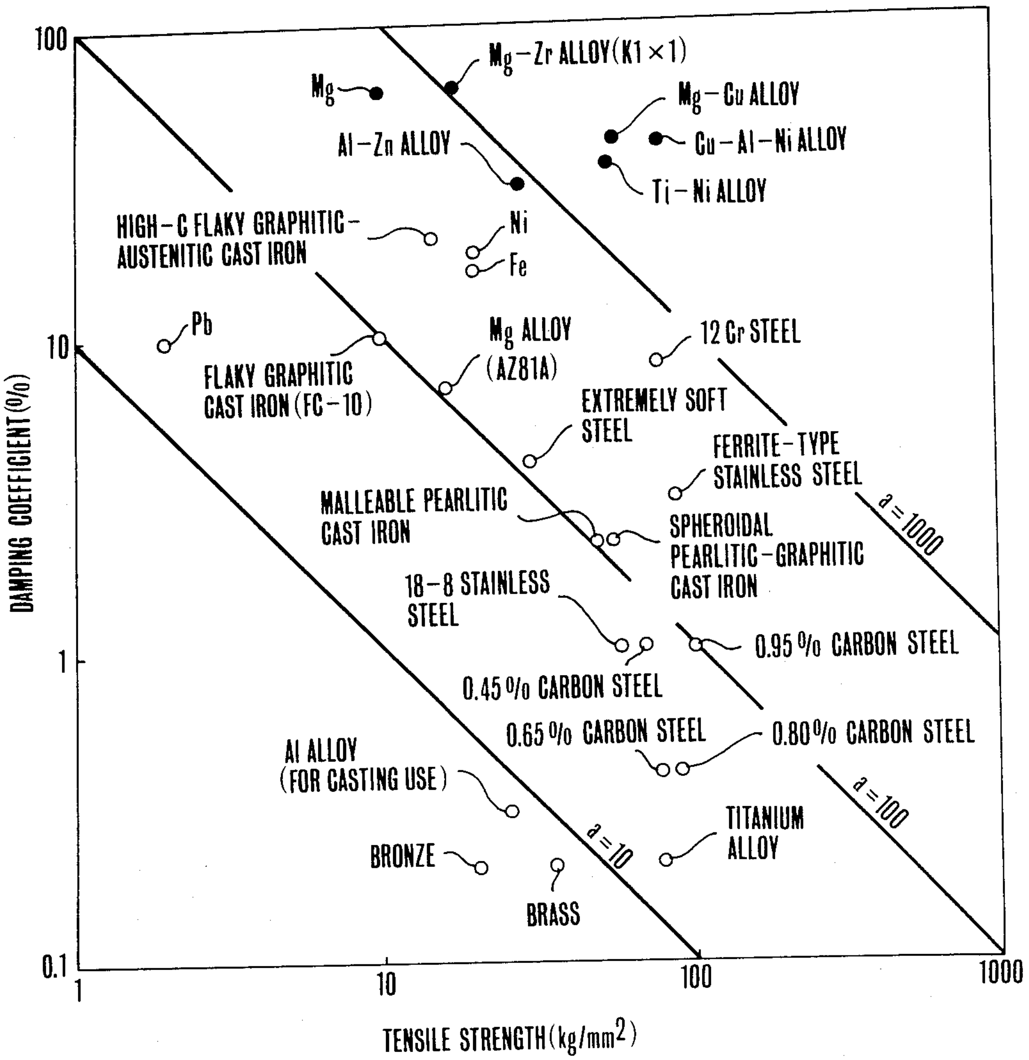
FIG. 7 is a graph, showing the relation between the strength and the oscillation-damping coefficient of various metals and alloys.

As already mentioned, the baffle board 42 is made of a highly rigid and/or highly oscillation-damping material, whose slip-elasticity being not lower than 2.3 Pa and whose damping coefficient being not lower than 2%, and it is desirable that its thickness is nearly the same as that of the enclosure. By the way, according to the experiment of the present inventors, it is suitable from the practical point of view that the thickness of the enclosure is in the range of 5 to 15 mm. In this example, in considering chemical durability, too, chromium plated 12 Cr-steel was used. Such materials as Cu-Al-Ni alloy, Ti-Ni alloy and Mn-Cu alloy may also be used effectively (cf. FIG. 7). In respect to the adhesive for fixing the baffle board 42 to the opening end 41a of the enclosure 1, when the hardness after adhesion is low or the adhesive is applied thick, there is a danger that the enclosure is vibrated due to sound pressure, so that it is desirable to apply a thin layer of an adhesive, such as epoxy, whose hardness becomes high after application.

A speaker system constructed in the way as above described with the use of 12-Cr steel as the baffle board was operated by connecting the speaker system to a known amplifier, and the result was compared with the case of using 18-8 stainless steel therefor, and it could be observed distinctly that, while the occurrence of box noise could be prevented completely when 12-Cr steel was used as a baffle board, some box noise occurred unavoidably, although not so violent, when 18-8 stainless steel was used. Indeed, as obvious from FIG. 7, the oscillation-damping coefficient of 12 Cr stainless steel is about 9 times as much as that of 18-8 stainless steel. Further, because of the fact that the baffle board 42 has a high rigidity, it is possible to prevent the deformation of the opening end 41*a* of the enclosure 1 and, accordingly, the occurrence of body noise caused to occur due to the enclosure 1 can perfectly be prevented.

As above described, the speaker system in this example is provided with a specific means for fixing a speaker unit to the globular glass enclosure for preventing the deformation and vibration of the enclosure due to the operation of the speaker system and, accordingly, the occurrence of box noise and/or body noise can be prevented perfectly. This example is to offer a high quality speaker system, and its merit in practical use is quite distinguished.

EXAMPLE 3

Figure 8:
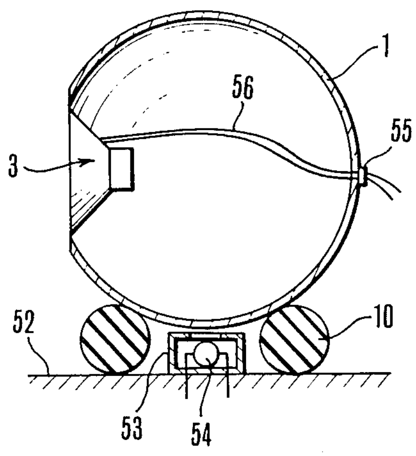
FIG. 8 is a sectional view of another example of the speaker system.

FIG. 8 shows a further example of the present inventive speaker system in which a light source is attached outside of the enclosure for improving the decorative effect of the speaker system. In the figure, 1 is a circular glass enclosure provided with a speaker unit 3 and mounted on a support member 10 as in Example 1. 52 is a stand on which the support member 10 is placed, 53 is an ultraviolet ray emission apparatus provided with an ultraviolet ray emission source 54. 55 is an input terminal of electric current, and 56 is a lead wire for connecting the terminal 55 to the speaker unit 3 similarly as in FIG. 6. A speaker system as in Example 2 can also be applicable.

In the case when transparent glass for the use of an enclosure contains such elements as Ce and other rare earth elements, such as Sm, Eu, Tb and Pb, the glass itself emits fluorescent light in response to the radiation of ultraviolent light, and this example is to utilize this phenomenon. However, ultraviolet light with a wavelength of less than 300 nm is harmful to human eyes, so that it is important to prevent that one's eyes fall directly upon such a light.

Figure 9:
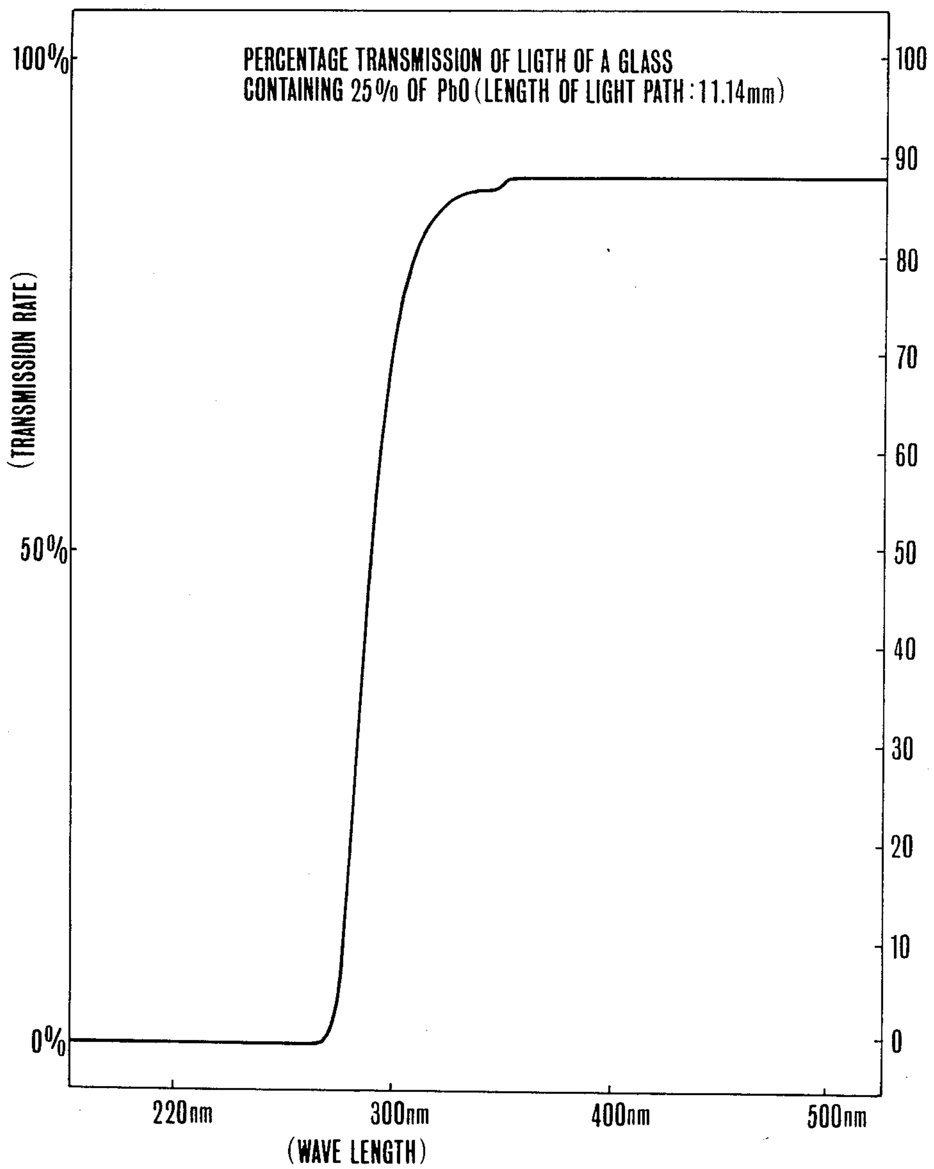
FIG. 9 is a graph, showing the transmission of light through a glass containing 25% PbO.

In this example, the enclosure 1 was made of lead crystal glass containing 25% of PbO with a thickness of 10 mm and an outer diameter of 280 mm, and a 4w Minerallight (trade name, manufactured by Ultraviolet Products Co, UVC-11), which radiates ultraviolet light with a wave length of 254 nm, was used as the ultraviolet ray emission source 54. In passing electric current through the ultraviolet ray emission apparatus 53 under the condition that the room was in the dim light of about 50 luxes, the enclosure 1 glowed beautifully in a pale blue light. The percentage transmission of light of a glass containing 25% of PbO used in the above experiment is as shown in FIG. 9. As obvious therefrom, the glass absorbs the light of 254 nm completely. Therefore, there is entirely no danger that the light with a harmful wavelength comes in sight.

In the case when the enclosure 1 was made of soda-lime glass containing 0.04% by weight of $CeO_2$ with a thickness of 10 mm and an outer diameter of 280 mm, and the enclosure 1 was radiated with ultraviolet ray with the use of an ultraviolet ray emission apparatus 53 comprising a 20w Black-light Fluorescent Lamp (trade name, wavelength 315–400 nm) similarly as before. Then, pale blue beautifully.

In this example, the enclosure itself serves as a luminescent body by utilizing the transparency of the glass, and its effect is more remarkable under the environment of dim light. Thus, the acoustic effect of this example is very high decoratively and psychologically. Further, since the light emission apparatus is provided out of the enclosure as compared with the conventional case of providing the light source inside of the enclosure, the speaker system has such merits that the excellent tone quality coming from the globular glass is not injured, there being no need of boring a hole through the enclosure for the wiring to the light source, and the safeguard of the light source is easy.

What is claimed is:

1. A speaker system comprising a globular enclosure made of glass to which a speaker unit is attached in an opening thereof; a baffle board fixed firmly in said opening of said enclosure, said baffle board being a highly rigid and/or highly oscillation damping material, having a slip-elasticity not lower than 2.3 Pa and an oscillation-damping coefficient not lower than 2%, the speaker unit being, in turn, fixed firmly to said baffle board; and a support member for elastically mounting said enclosure thereon, said support member consisting of an elastic material selected from the group consisting of chlorinated polyethylene, silicone rubber and neoprene rubber, having a large friction coefficient to said enclosure, and having an opening to accommodate a bottom part of the enclosure therein.

2. A speaker system according to claim 1, wherein the glass constituting said enclosure is transparent and contains elements to generate fluorescent light when irradiated with ultraviolet light, and said speaker system includes a light source for radiating light chiefly in the ultraviolet region toward said enclosure provided outside of said enclosure.

3. A speaker system according to claim 8, wherein the highly rigid and/or highly oscillation-damping material for constituting the baffle board is selected from the group consisting of 12-Cr steel, Cu-Al-Ni alloy, Ti-Ni alloy and Mn-Cu alloy.

4. A speaker system comprising a globular enclosure made of glass to which a speaker unit is attached, and a support member for elastically mounting said enclosure thereon, said support member consisting of an elastic material selected from the group consisting of chlorinated polyethylene, silicone rubber and neoprene rubber, having a large friction coefficient to said enclosure, and having an opening to accommodate a bottom part of the enclosure therein, the glass constituting said enclosure being transparent and containing elements to generate fluorescent light when irradiated with ultraviolet light, and said speaker system including a light source to radiate light chiefly in the ultraviolet region toward said enclosure provided outside of said enclosure.

5. A speaker system according to claim 4, wherein the element contained in the glass to generate fluorescent light in response to being irradiated with ultraviolet light is selected from the group consisting of Pb and rare earth elements such as Ce, Sm, Eu, Tb.

* * * * *